US012635228B2

(12) United States Patent
Kim et al.

(10) Patent No.: US 12,635,228 B2
(45) Date of Patent: May 19, 2026

(54) POWER SEMICONDUCTOR DEVICE

(71) Applicant: DB HITEK CO., LTD., Seoul (KR)

(72) Inventors: Young Bae Kim, Gyeonggi-do (KR);
Hong Sik Shin, Gyeonggi-do (KR)

(73) Assignee: DB HiTek Co., Ltd., Seoul (KR)

( * ) Notice: Subject to any disclaimer, the term of this
patent is extended or adjusted under 35
U.S.C. 154(b) by 357 days.

(21) Appl. No.: 18/225,753

(22) Filed: Jul. 25, 2023

(65) Prior Publication Data

US 2024/0243123 A1 Jul. 18, 2024

(30) Foreign Application Priority Data

Jan. 13, 2023 (KR) ........................ 10-2023-0005397

(51) Int. Cl.
*H10D 84/60* (2025.01)
*H10D 84/00* (2025.01)
*H10D 84/40* (2025.01)
*H10D 87/00* (2026.01)
*H10D 89/60* (2025.01)

(52) U.S. Cl.
CPC ......... *H10D 84/619* (2025.01); *H10D 84/204*
(2025.01); *H10D 84/206* (2025.01); *H10D*
*84/409* (2025.01); *H10D 84/611* (2025.01);
*H10D 87/00* (2025.01); *H10D 89/601*
(2025.01); *H10D 89/611* (2025.01); *H10D*
*89/711* (2025.01)

(58) Field of Classification Search
CPC .. H10D 84/204; H10D 84/206; H10D 84/401;
H10D 84/409; H10D 84/611; H10D
84/519; H10D 87/00; H10D 89/60; H10D
89/601; H10D 89/611; H10D 89/711;
H10D 84/619
See application file for complete search history.

(56) References Cited

U.S. PATENT DOCUMENTS

| | | | | | |
|---|---|---|---|---|---|
| RE35,745 E | * | 3/1998 | Barsanti | ............... | H03K 17/063 |
| | | | | | 326/88 |
| 2010/0271079 A1 | * | 10/2010 | Choi | .................... | H03K 17/567 |
| | | | | | 327/108 |
| 2016/0134279 A1 | * | 5/2016 | Sicard | .................. | H03K 17/165 |
| | | | | | 327/109 |

FOREIGN PATENT DOCUMENTS

| | | | | |
|---|---|---|---|---|
| JP | | H11205112 A | * | 7/1999 |
| KR | 10-2016-0029602 A | | | 3/2016 |
| KR | 10-2022-0016316 A | | | 2/2022 |

(Continued)

*Primary Examiner* — Matthew E Warren
(74) *Attorney, Agent, or Firm* — Bridgeway IP Law
Group, PLLC; Jihun Kim

(57) ABSTRACT

A power semiconductor device includes a high voltage unit
configured to output a high voltage, a low voltage unit
configured to output a low voltage, a capacitor electrically
connected to the high voltage unit and supplying power to
the high voltage unit while the high voltage is output, a
switching unit electrically connected to the high voltage unit
and the capacitor and configured to connect the capacitor to
a driving power source to charge the capacitor while the low
voltage is output and to prevent the high voltage unit from
being electrically connected to the driving power source
while the high voltage is output, and a resistance unit
electrically connected between the switching unit and the
high voltage unit and configured to drop the high voltage to
a voltage lower than a breakdown voltage of the switching
unit while the high voltage is output.

11 Claims, 8 Drawing Sheets

(56) References Cited

FOREIGN PATENT DOCUMENTS

WO     2012/176347  A1    12/2012

* cited by examiner

FIG. 4

POWER SEMICONDUCTOR DEVICE

CROSS-REFERENCE TO RELATED APPLICATION

This application claims the priority benefit of Korean Patent Application No. 10-2023-0005397, filed on Jan. 13, 2023, and all the benefits accruing therefrom under 35 U.S.C. § 119, the contents of which are incorporated by reference in their entirety.

TECHNICAL FIELD

The present disclosure relates to a power semiconductor device. More specifically, the present disclosure relates to a power semiconductor device including a bootstrap circuit, for example, a high voltage integrated circuit (HVIC).

BACKGROUND

A power semiconductor device may include a high voltage unit and a low voltage unit, and further include a bootstrap circuit for stable operation of the high voltage unit. The bootstrap circuit may include a capacitor connected to the high voltage unit to provide power.

The bootstrap circuit may connect the capacitor to a driving power source to charge the capacitor while the low voltage unit outputs a low voltage, and may include a diode preventing the driving power source from being electrically connected to the high voltage unit while the high voltage unit outputs a high voltage. However, the diode may be damaged when the high voltage is directly applied to the diode. Accordingly, a transistor for preventing the high voltage from being applied to the diode may be additionally provided between the high voltage unit and the diode.

When the transistor is used as described above, the size of the power semiconductor device may be increased. Further, an electron movement distance may be increased by the transistor, thereby reducing a current directed to the capacitor while charging the capacitor.

SUMMARY

The present disclosure provides an improved power semiconductor device capable of solving the above problems.

In accordance with an aspect of the present disclosure, a power semiconductor device may include a high voltage unit configured to output a high voltage, a low voltage unit configured to output a low voltage, a capacitor electrically connected to the high voltage unit and supplying power to the high voltage unit while the high voltage is output, a switching unit electrically connected to the high voltage unit and the capacitor and configured to connect the capacitor to a driving power source to charge the capacitor while the low voltage is output and to prevent the high voltage unit from being electrically connected to the driving power source while the high voltage is output, and a resistance unit electrically connected between the switching unit and the high voltage unit and configured to drop the high voltage to a voltage lower than a breakdown voltage of the switching unit while the high voltage is output.

In accordance with some embodiments of the present disclosure, the resistance unit may include an N-type impurity diffusion region formed in a substrate and electrically connected between the switching unit and the high voltage unit.

In accordance with some embodiments of the present disclosure, the switching unit may include a bipolar junction transistor or a diode.

In accordance with some embodiments of the present disclosure, the resistance unit may further include a field oxide layer formed on the substrate.

In accordance with some embodiments of the present disclosure, the resistance unit may further include a P-type impurity diffusion region formed between the N-type impurity diffusion region and the field oxide layer.

In accordance with some embodiments of the present disclosure, the resistance unit may further include a first electrode layer formed on the field oxide layer adjacent to the switching unit and electrically connected to a ground terminal, and a second electrode layer formed on the field oxide layer adjacent to the high voltage unit and electrically connected to the high voltage unit.

In accordance with some embodiments of the present disclosure, the resistance unit may further include a first contact region formed on one side of the N-type impurity diffusion region and electrically connected to the switching unit, and a second contact region formed on another side of the N-type impurity diffusion region and electrically connected to the high voltage unit.

In accordance with some embodiments of the present disclosure, the resistance unit may further include an N-type buried layer formed below the second contact region and configured to disperse an electric field generated by the high voltage when the high voltage is applied to the second contact region.

In accordance with some embodiments of the present disclosure, the resistance unit may include a field oxide layer formed on a substrate, and a resistive layer formed on the field oxide layer.

In accordance with some embodiments of the present disclosure, the resistive layer may be made of polysilicon doped with N-type impurities.

In accordance with another aspect of the present disclosure, a power semiconductor device may include a high voltage unit configured to output a high voltage, a low voltage unit configured to output a low voltage, a capacitor electrically connected to the high voltage unit and supplying power to the high voltage unit while the high voltage is output, a bipolar junction transistor electrically connected to the high voltage unit and the capacitor and configured to connect the capacitor to a driving power source to charge the capacitor while the low voltage is output and to prevent the high voltage unit from being electrically connected to the driving power source while the high voltage is output, and a resistance unit electrically connected between the bipolar junction transistor and the high voltage unit and configured to drop the high voltage to a voltage lower than a breakdown voltage of the bipolar junction transistor while the high voltage is output.

In accordance with some embodiments of the present disclosure, the bipolar junction transistor may include an N-type emitter region formed on a substrate, a P-type base region formed on the substrate, and an N-type collector region formed on the substrate. In such case, the P-type base region and the N-type collector region may be electrically connected to the driving power source, and the N-type emitter region may be electrically connected to the resistance unit.

In accordance with some embodiments of the present disclosure, the bipolar junction transistor may further include a P-type well region formed in the substrate. In such case, the N-type emitter region and the P-type base region may be formed on the P-type well region.

In accordance with some embodiments of the present disclosure, the bipolar junction transistor may further include an N-type buried layer formed in the substrate. In such case, the P-type well region may be formed on the N-type buried layer.

In accordance with some embodiments of the present disclosure, the P-type base region may have a ring shape surrounding the N-type emitter region, and the N-type collector region may have a ring shape surrounding the P-type base region.

In accordance with still another aspect of the present disclosure, a power semiconductor device may include a high voltage unit configured to output a high voltage, a low voltage unit configured to output a low voltage, a capacitor electrically connected to the high voltage unit and supplying power to the high voltage unit while the high voltage is output, a diode electrically connected to the high voltage unit and the capacitor and configured to connect the capacitor to a driving power source to charge the capacitor while the low voltage is output and to prevent the high voltage unit from being electrically connected to the driving power source while the high voltage is output, and a resistance unit electrically connected between the diode and the high voltage unit and configured to drop the high voltage to a voltage lower than a breakdown voltage of the diode while the high voltage is output.

In accordance with some embodiments of the present disclosure, the diode may include a field oxide layer formed on a substrate, an anode layer formed on the field oxide layer, and a cathode layer formed on the field oxide layer. In such case, the anode layer may be electrically connected to the driving power source, and the cathode layer may be electrically connected to the resistance unit.

In accordance with some embodiments of the present disclosure, the anode layer may be made of polysilicon doped with P-type impurities, and the cathode layer may be made of polysilicon doped with N-type impurities.

In accordance with the embodiments of the present disclosure as described above, there is no need to additionally use a transistor to prevent the high voltage from being applied to the switching unit from the high voltage unit, and accordingly, the size of the power semiconductor device may be reduced. Further, an electron movement distance may be reduced compared to the prior art, and electrical resistance may be reduced by the N-type impurity diffusion region. Accordingly, a current flowing from the driving power source to the capacitor may increase.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Embodiments can be understood in more detail from the following description taken in conjunction with the accompanying drawings, in which:

FIG. 4 is a schematic cross-sectional view illustrating another example of the resistance unit as shown in FIG. 3;

Figure 1:
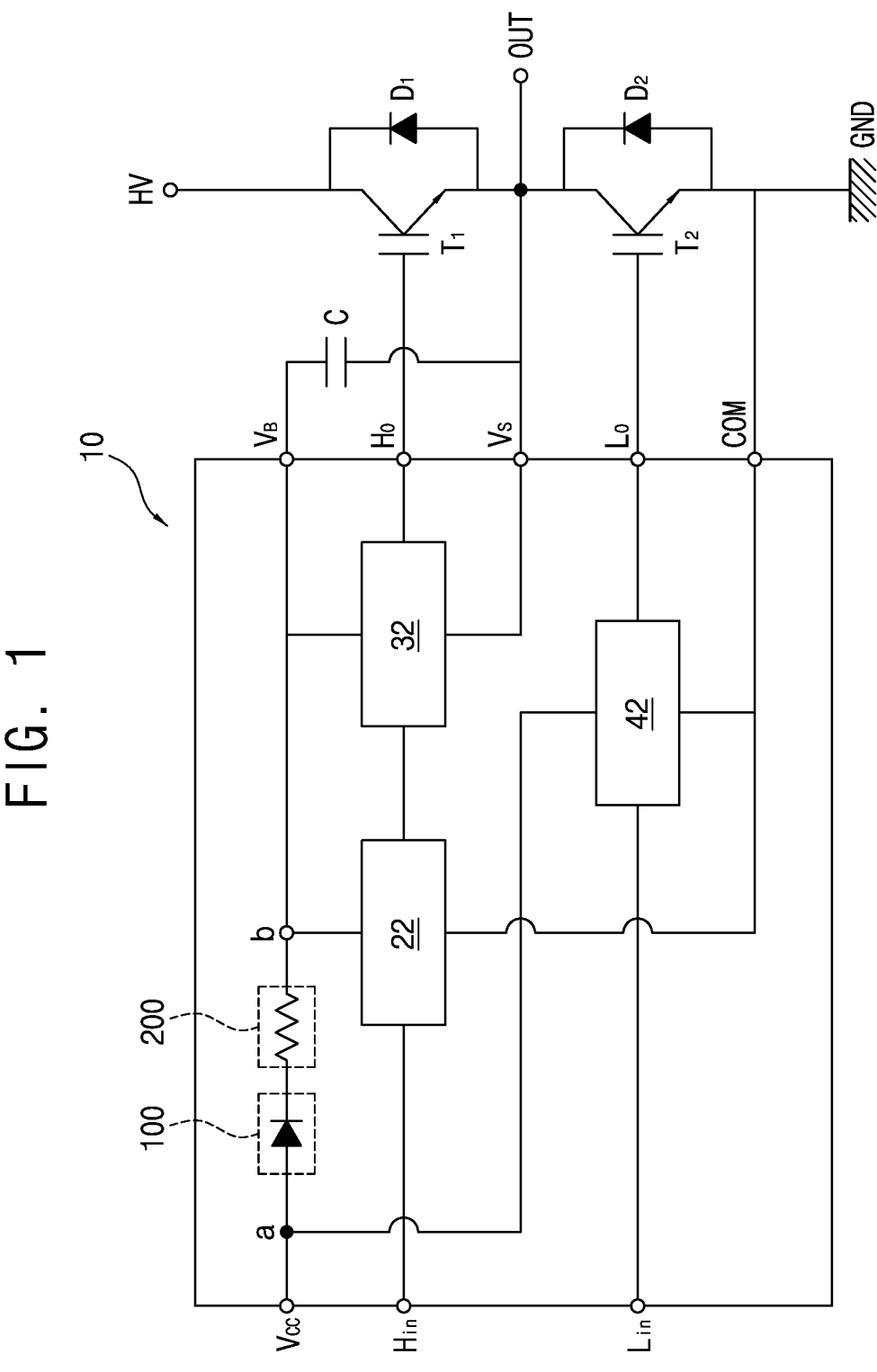
FIG. 1 is an equivalent circuit diagram illustrating a power semiconductor device in accordance with an embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present disclosure are described in more detail with reference to the accompanying drawings. However, the present disclosure is not limited to the embodiments described below and is implemented in various other forms. Embodiments below are not provided to fully complete the present disclosure but rather are provided to fully convey the range of the present disclosure to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present disclosure, the regions and the layers are not limited to these terms.

Terminologies used below are used to merely describe specific embodiments, but do not limit the present disclosure. Additionally, unless otherwise defined here, all the terms including technical or scientific terms, may have the same meaning that is generally understood by those skilled in the art.

Embodiments of the present disclosure are described with reference to schematic drawings of ideal embodiments. Accordingly, changes in manufacturing methods and/or allowable errors may be expected from the forms of the drawings. Accordingly, embodiments of the present disclosure are not described being limited to the specific forms or areas in the drawings, and include the deviations of the forms. The areas may be entirely schematic, and their forms may not describe or depict accurate forms or structures in any given area, and are not intended to limit the scope of the present disclosure.

Figure 2:
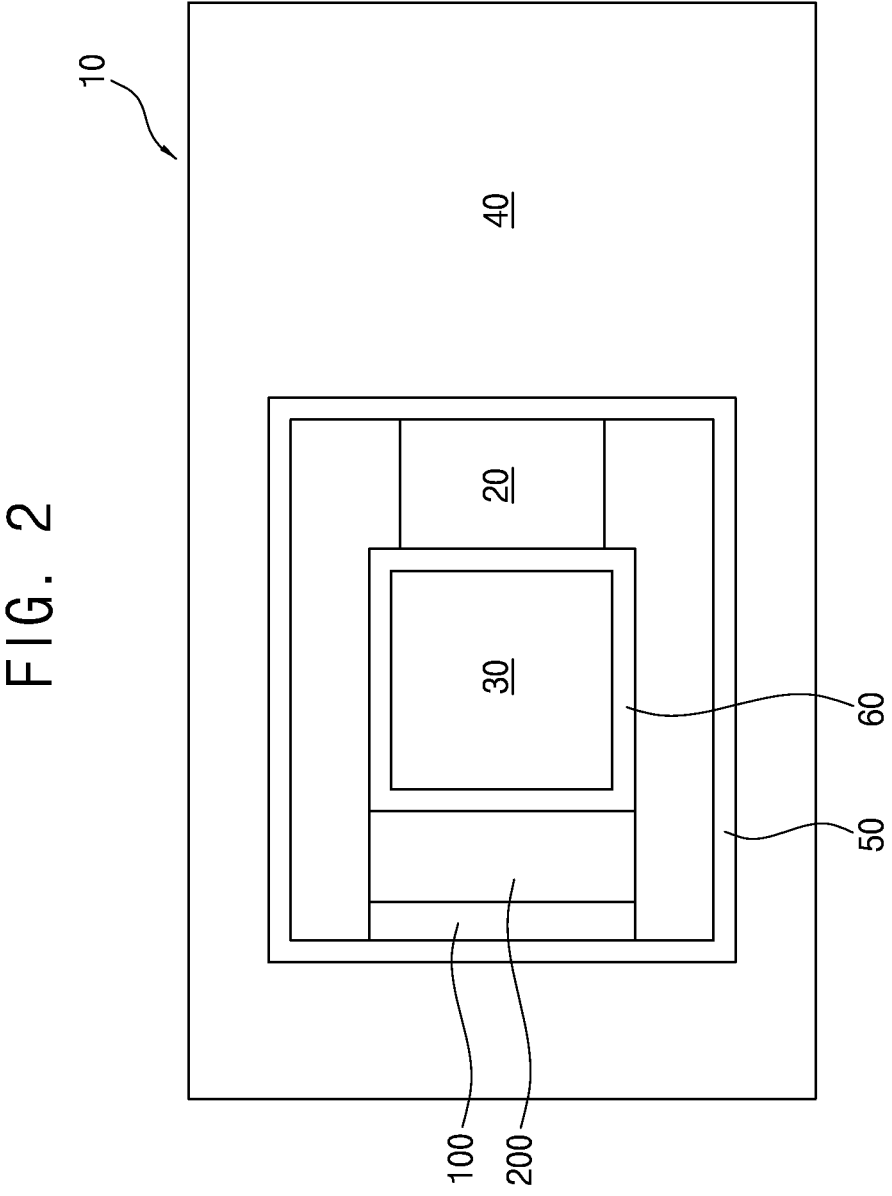
FIG. 2 is a schematic plan view illustrating the semiconductor device as shown in FIG. 1.

FIG. 1 is an equivalent circuit diagram illustrating a power semiconductor device in accordance with an embodiment of the present disclosure, and FIG. 2 is a schematic plan view illustrating the semiconductor device as shown in FIG. 1.

Referring to FIGS. 1 and 2, a power semiconductor device 10, in accordance with an embodiment of the present disclosure, may include a high voltage unit 30, a low voltage unit 40, a capacitor C, a switching unit 100, and a resistance unit 200. The high voltage unit 30 may include a high voltage driving circuit 32 and a first power transistor $T_1$, and the low voltage unit 40 may include a low voltage driving circuit 42 and a second power transistor T$_2$.

The capacitor C may be connected in parallel to power supply terminals V$_B$ and V$_S$ providing power to the high voltage driving circuit 32. An output terminal H$_O$ of the high voltage driving circuit 32 may be connected to a gate of the first power transistor T$_1$, and the first power transistor T$_1$ may be connected in parallel with a first diode D$_1$. An output terminal L$_O$ of the low voltage driving circuit 42 may be connected to a gate of the second power transistor T$_2$, and the second power transistor T$_2$ may be connected in parallel with a second diode D$_2$. A source of the first power transistor T$_1$ may be connected to a high voltage terminal HV, and the first power transistor T$_1$ and the second power transistor T$_2$ may be connected in series. A drain of the second power transistor T$_2$ may be connected to a ground terminal GND.

The low voltage driving circuit 42 may control the second power transistor T$_2$ by outputting a low voltage control signal to the low voltage output terminal L$_O$ according to a signal input through the low voltage input terminal L$_{in}$. The low voltage driving circuit 42 may be operated by a potential difference between a ground voltage of a common terminal COM and a driving voltage of a driving power source V$_{CC}$.

The high voltage driving circuit 32 may output a high voltage control signal to the high voltage control terminal H$_O$ in response to a signal provided from a level shift circuit 22 to control the first power transistor T$_1$. The high voltage driving circuit 32 may operate by receiving power from the capacitor C connected between a terminal V$_S$ and a terminal V$_B$ having the same potential as an output terminal OUT. The level shift circuit 22 may provide a signal input from a high voltage input terminal H$_{in}$ to the high voltage driving circuit 32. A reference voltage of the high voltage driving circuit 32 may be a high voltage HV or a low voltage, such as a ground voltage, according to a state of a pulse width modulation (PWM) signal output from the output terminal OUT.

The power semiconductor device 10 may output a high voltage HV or a low voltage, for example, a ground voltage, to the output terminal OUT in response to signals input from the high voltage input terminal H$_{in}$ and the low voltage input terminal L$_{in}$. Specifically, when the low voltage driving circuit 42 turns on the second power transistor T$_2$ through the low voltage output terminal L$_O$, the output terminal OUT may output a low voltage, for example, a ground voltage. At this time, the second diode D$_2$ may prevent reverse voltage. In addition, in order to prevent both the high voltage and the low voltage from being applied to the output terminal OUT, the high voltage driving circuit 32 may turn off the first power transistor T$_1$. That is, the ground voltage applied to the output terminal OUT and the driving voltage from the driving power source V$_{CC}$ may be applied to the high voltage driving circuit 32. Further, the driving power source V$_{CC}$ may charge the capacitor C at an approximate driving voltage by providing a current to the capacitor C through the switching unit 100 and the resistance unit 200.

When the low voltage driving circuit 42 outputs an off signal, and the high voltage driving circuit 32 provides an on signal to the first power transistor T$_1$ through the high voltage output terminal H$_O$ to turn on the first power transistor T$_1$, the output terminal OUT may output a high voltage HV. At this time, the first diode D$_1$ may prevent reverse voltage. In addition, the high voltage HV may be applied to the terminal V$_S$, and the high voltage HV and the charging voltage of the capacitor C may be applied to the terminal V$_B$.

In accordance with an embodiment of the present disclosure, the switching unit 100 may include a bipolar junction transistor or a diode. In particular, when the high voltage unit 30 outputs the high voltage, the driving voltage may be applied to node (a), and the high voltage HV and the charging voltage of the capacitor C may be applied to node (b). As a result, a reverse voltage is applied to the switching unit 100, and accordingly, the switching unit 100 may prevent the high voltage unit 30 and the driving power source V$_{CC}$ from being electrically connected to each other.

However, since the potential difference between the node (a) and the node (b) is very high enough to reach the high voltage HV, the switching unit 100 may be damaged. The resistance unit 200 may be disposed between the switching unit 100 and the high voltage unit 30 to prevent damage to the switching unit 100. The resistance unit 200 may drop the high voltage HV to a voltage lower than the breakdown voltage of the switching unit 100 while the high voltage HV is output, thereby preventing the switching unit 100 from being damaged by the reverse voltage.

Referring to FIG. 2, the power semiconductor device 10 may be formed on a substrate, for example, a semiconductor wafer. Specifically, the low voltage unit 40 may be formed to surround the high voltage unit 30, and a first device isolation region 50 and a second device isolation region 60 may be formed between the high voltage unit 30 and the low voltage unit 40. Further, a level shift region 20 in which the level shift circuit 22 is formed may be formed between the high voltage unit 30 and the low voltage unit 40. In addition, the switching unit 100 and the resistance unit 200 may be formed between the high voltage unit 30 and the low voltage unit 40. Particularly, the resistance unit 200 may be formed between the switching unit 100 and the high voltage unit 30.

Figure 3:
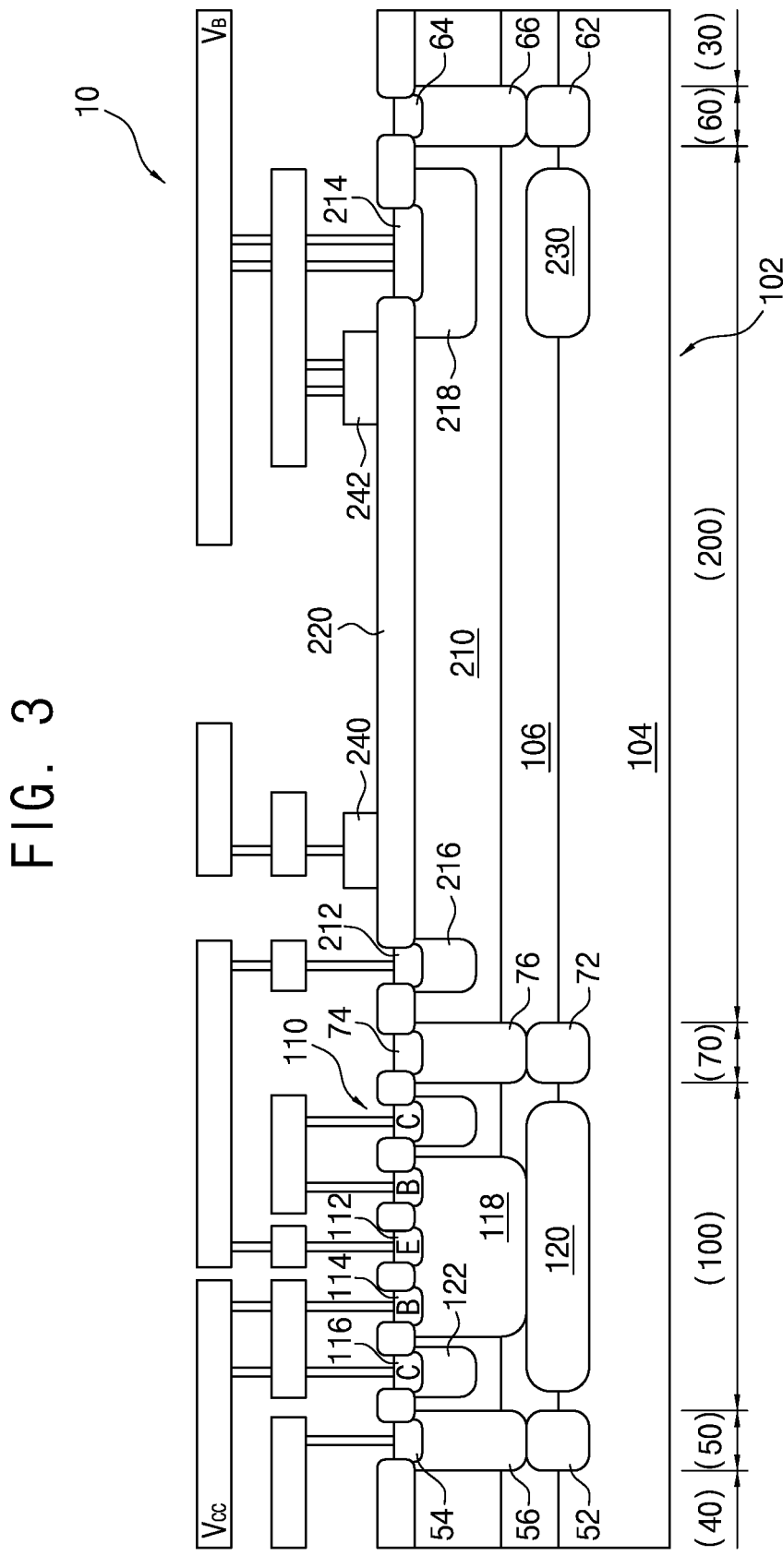
FIG. 3 is a schematic cross-sectional view illustrating a switching unit and a resistance unit as shown in FIG. 2.

FIG. 3 is a schematic cross-sectional view illustrating a switching unit and a resistance unit as shown in FIG. 2.

Referring to FIG. 3, the switching unit 100 may include an NPN type bipolar junction transistor 110. For example, the bipolar junction transistor 110 may include an N-type emitter region 112 formed on a substrate 102, A P-type base region 114 formed on the substrate 102, and an N-type collector region 116 formed on the substrate 102. As an example, the substrate 102 may include a P-type bulk silicon substrate 104 and an N-type epitaxial layer 106 formed on the bulk silicon substrate 104, and the N-type emitter region 112, the P-type base region 114, and the N-type collector region 116 may be formed above the N-type epitaxial layer 106.

The bipolar junction transistor 110 may include a P-type well region 118 formed in the substrate 102. In such case, the N-type emitter region 112 and the P-type base region 114 may be formed on the P-type well region 118. In addition, a first N-type buried layer 120 may be formed in the substrate 102, and the P-type well region 118 may be formed on the first N-type buried layer 120. In such case, the first N-type buried layer 120 may be used to reduce leakage current of the bipolar junction transistor 110.

Although not shown in figures, the P-type base region 114 may have a ring shape surrounding the N-type emitter region 112, and the N-type collector region 116 may have a ring shape surrounding the P-type base region 114. Field oxide layers may be formed between the N-type emitter region 112 and the P-type base region 114 and between the P-type base region 114 and the N-type collector region 116, and the N-type emitter region 112, the P-type base region 114, and the N-type collector region 116 may be electrically isolated from one another by the field oxide layers.

The first device isolation region 50 may be formed between the low voltage unit 40 and the bipolar junction transistor 110. The first device isolation region 50 may include a first P-type buried layer 52 formed in the substrate 102, a first P-type contact region 54 formed on the substrate 102, and a first P-type impurity diffusion region 56 formed between the first P-type buried layer 52 and the first P-type contact region 54.

A third device isolation region 70 may be formed between the bipolar junction transistor 110 and the resistance unit 200. The third device isolation region 70 may include a third P-type buried layer 72 formed in the substrate 102, a third P-type contact region 74 formed on the substrate 102, and a third P-type impurity diffusion region 76 formed between the third P-type buried layer 72 and the third P-type contact region 74.

The first device isolation region 50 and the third device isolation region 70 may be formed to surround the bipolar junction transistor 110. In particular, the first N-type buried layer 120, the first P-type buried layer 52, and the third P-type buried layer 72 may be formed between the bulk silicon substrate 104 and the N-type epitaxial layer 106. Further, the first P-type buried layer 52 and the third P-type buried layer 72 may be formed to surround the first N-type buried layer 120.

The P-type base region 114 and the N-type collector region 116 may be electrically connected to the driving power source $V_{CC}$ by metal wires and contact plugs. The N-type emitter region 112 may be electrically connected to the resistance unit 200 by metal wires and contact plugs.

While the low voltage is output from the low voltage unit 40, current may flow from the P-type base region 114 and the N-type collector region 116 to the N-type emitter region 112, and the current may charge the capacitor C through the resistance unit 200. According to an embodiment of the present disclosure, an N-type well region 122 may be formed to surround the P-type well region 118 in the substrate 102. In such case, the N-type collector region 116 may be formed on the N-type well region 122, thereby reducing internal resistance of the bipolar junction transistor 110.

The resistance unit 200 may include an N-type impurity diffusion region 210 formed in the substrate 102. For example, the N-type impurity diffusion region 210 may be formed in an upper portion of the N-type epitaxial layer 106. Further, the resistance unit 200 may include a field oxide layer 220 formed on the substrate. For example, the field oxide layer 220 may be formed on the N-type impurity diffusion region 210. In particular, when the low voltage unit 40 outputs the low voltage, a forward voltage may be applied to the bipolar junction transistor 110 and the resistance unit 200, and thus the electrical resistance of the N-type impurity diffusion region 210 may be reduced. Further, when the high voltage unit 30 outputs the high voltage, a reverse voltage may be applied to the bipolar junction transistor 110 and the resistance unit 200, and thus the electrical resistance of the N-type impurity diffusion region 210 may increase.

The resistance unit 200 may include a first N-type contact region 212 formed on a portion of the N-type impurity diffusion region 210 and a second N-type contact region 214 formed on another portion of the N-type impurity diffusion region 210. In such case, the field oxide layer 220 may be formed between the first N-type contact region 212 and the second N-type contact region 214. Further, a first N-type well region 216 may be formed between the first N-type contact region 212 and the N-type impurity diffusion region 210, and a second N-type well region 218 may be formed between the second N-type contact region 214 and the N-type impurity diffusion region 210.

The first and second N-type contact regions 212 and 214 may have a higher impurity concentration than the first and second N-type well regions 216 and 218. The first N-type contact region 212 may be electrically connected to the switching unit 100 through metal wires and contact plugs, and the second N-type contact region 214 may be electrically connected to the high voltage unit 30 and the capacitor C through metal wires and contact plugs.

The N-type impurity diffusion region 210 may have a lower impurity concentration than the first and second N-type well regions 216 and 218. In particular, the impurity concentration of the N-type impurity diffusion region 210 may be appropriately adjusted to drop the high voltage to a voltage lower than the breakdown voltage of the switching unit 100 while the high voltage is being output from the high voltage unit 30. Specifically, the N-type impurity diffusion region 210 may drop the high voltage to a voltage lower than the breakdown voltage of the switching unit 100 and higher than the driving voltage. As a result, even if reverse voltage is applied to the switching unit 100 while the high voltage is being output, because the reverse voltage is lower than the breakdown voltage of the switching unit 100, damage to the switching unit 100 may be prevented.

The second device isolation region 60 may be formed between the high voltage unit 30 and the resistance unit 200. The second device isolation region 60 may include a second P-type buried layer 62 formed in the substrate 102, a second P-type contact region 64 formed on the substrate 102, and a second P-type impurity diffusion region 66 formed between the second P-type buried layer 62 and the second P-type contact region 64.

When the high voltage is applied from the high voltage unit 30 to the second N-type contact region 214, a second N-type buried layer 230 may be formed in the substrate 102 to disperse an electric field generated by the high voltage. For example, the second N-type buried layer 230 may be formed below the second N-type contact region 214 and between the bulk silicon substrate 104 and the N-type epitaxial layer 106.

A first electrode layer 240 may be formed on the field oxide layer 220 to be adjacent to the switching unit 100, and a second electrode layer 242 may be formed to be adjacent to the high voltage unit 30. The first electrode layer 240 may be electrically connected to the ground terminal GND, and the second electrode layer 242 may be electrically connected to the high voltage unit 30. For example, the first and second electrode layers 240 and 242 may be formed of polysilicon doped with N-type impurities.

Figure 4:
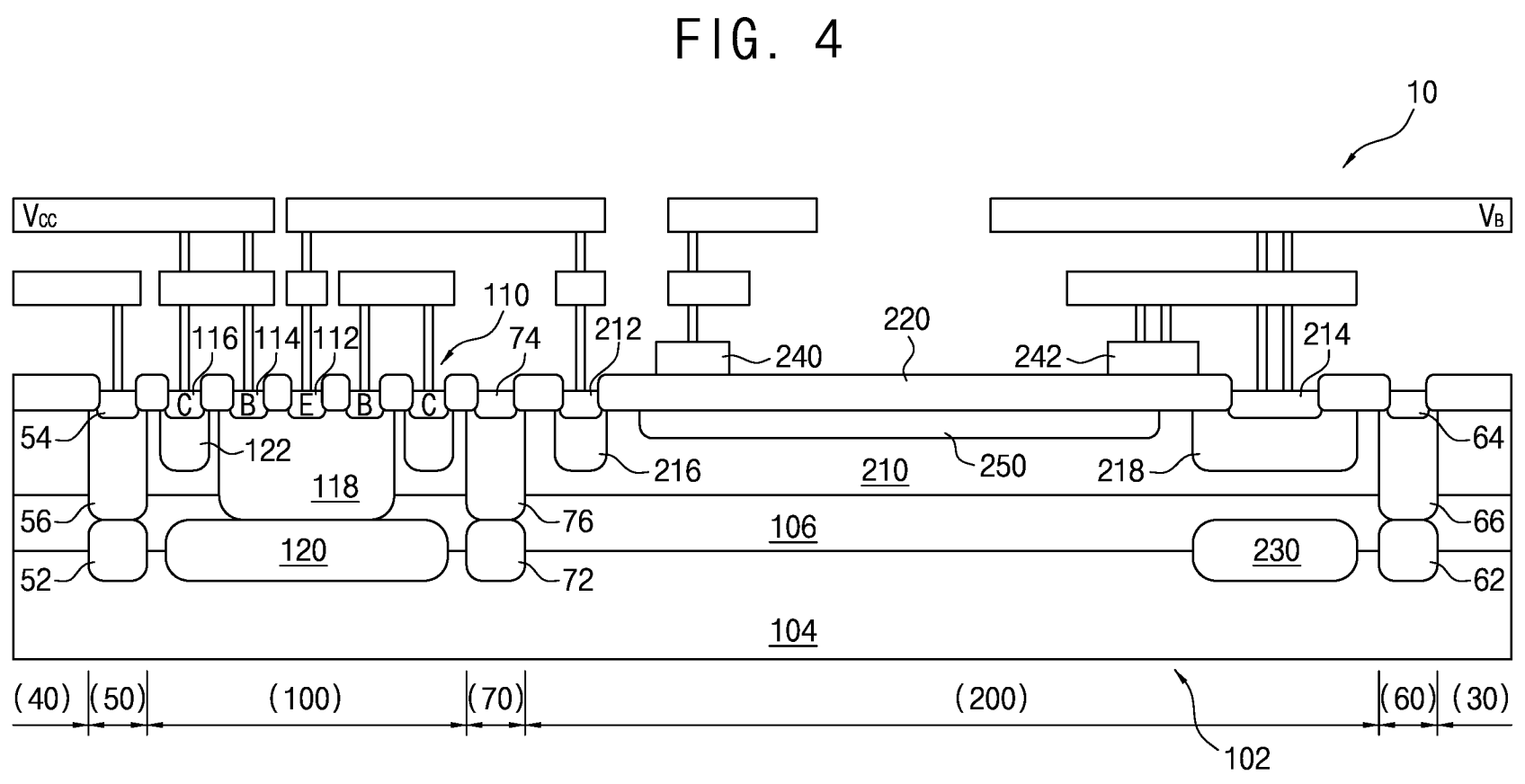

FIG. 4 is a schematic cross-sectional view illustrating another example of the resistance unit as shown in FIG. 3.

Referring to FIG. 4, the resistance unit 200 may include a P-type impurity diffusion region 250 formed on the N-type impurity diffusion region 210. For example, the P-type impurity diffusion region 250 may be formed between the N-type impurity diffusion region 210 and the field oxide layer 220. In such case, a depletion layer (not shown) may be formed between the N-type impurity diffusion region 210 and the P-type impurity diffusion region 250. In particular, the depletion layer may be expanded by the high voltage applied to the second N-type contact region 214 while the high voltage unit 30 outputs the high voltage, and accordingly, the electrical resistance of the resistance unit 200 may increase. In addition, the depletion layer may be more uniformly formed by the first electrode layer 240 and the second electrode layer 242.

Figure 5:
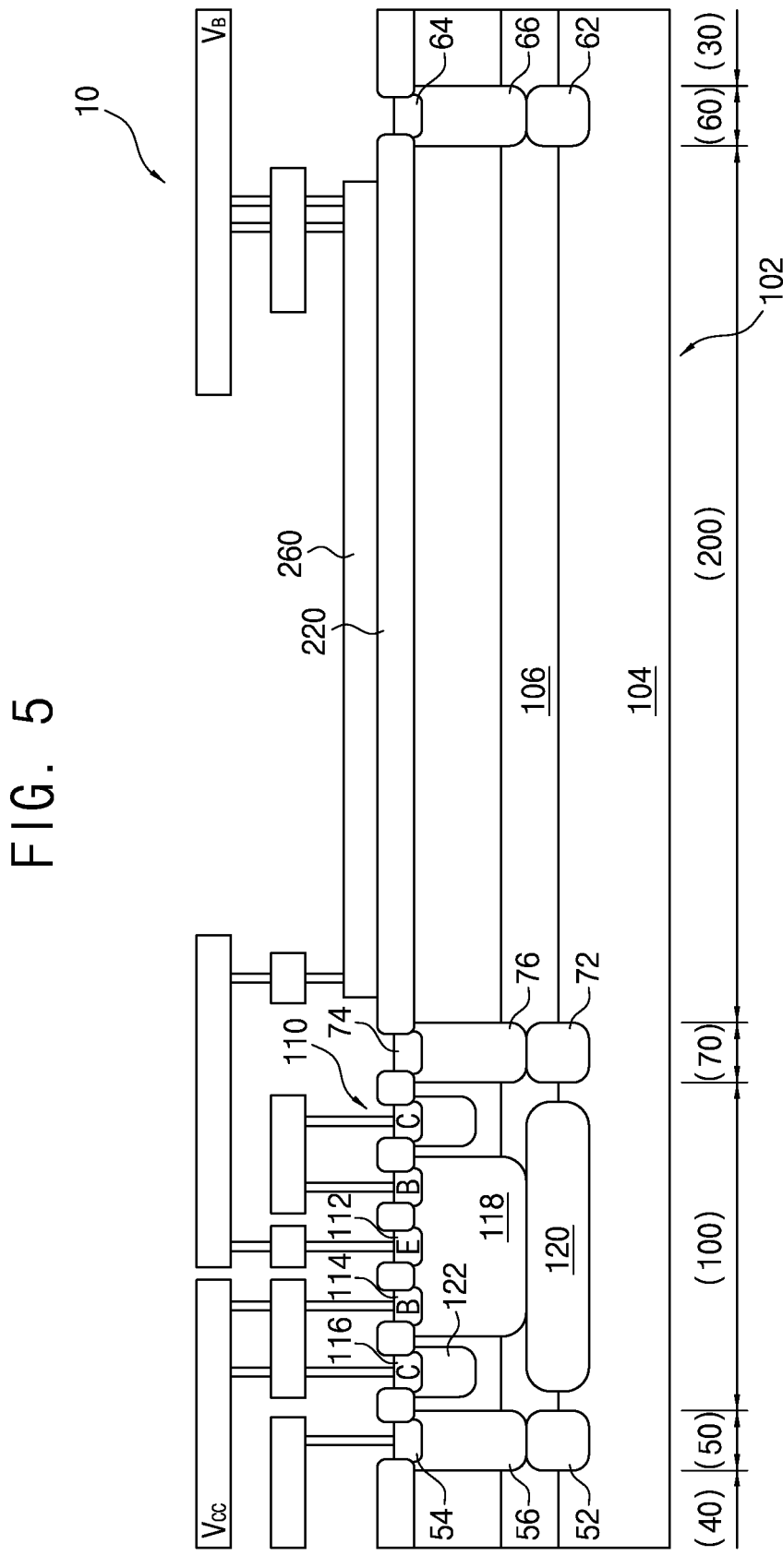
FIG. 5 is a schematic cross-sectional view illustrating still another example of the resistance unit as shown in FIG. 3.

FIG. 5 is a schematic cross-sectional view illustrating still another example of the resistance unit as shown in FIG. 3.

Referring to FIG. 5, the resistance unit 200 may include a resistive layer 260 formed on the field oxide layer 220. One end portion of the resistive layer 260 may be electrically connected to the switching unit 100, and another end portion of the resistive layer 260 may be electrically connected to the high voltage unit 30 and the capacitor C. For example, the resistive layer 260 may be formed of polysilicon doped with N-type impurities, and an impurity concentration of the resistive layer 260 may be appropriately adjusted to drop the high voltage to a voltage lower than the breakdown voltage of the switching unit 100 while the high voltage is being output.

Figure 6:
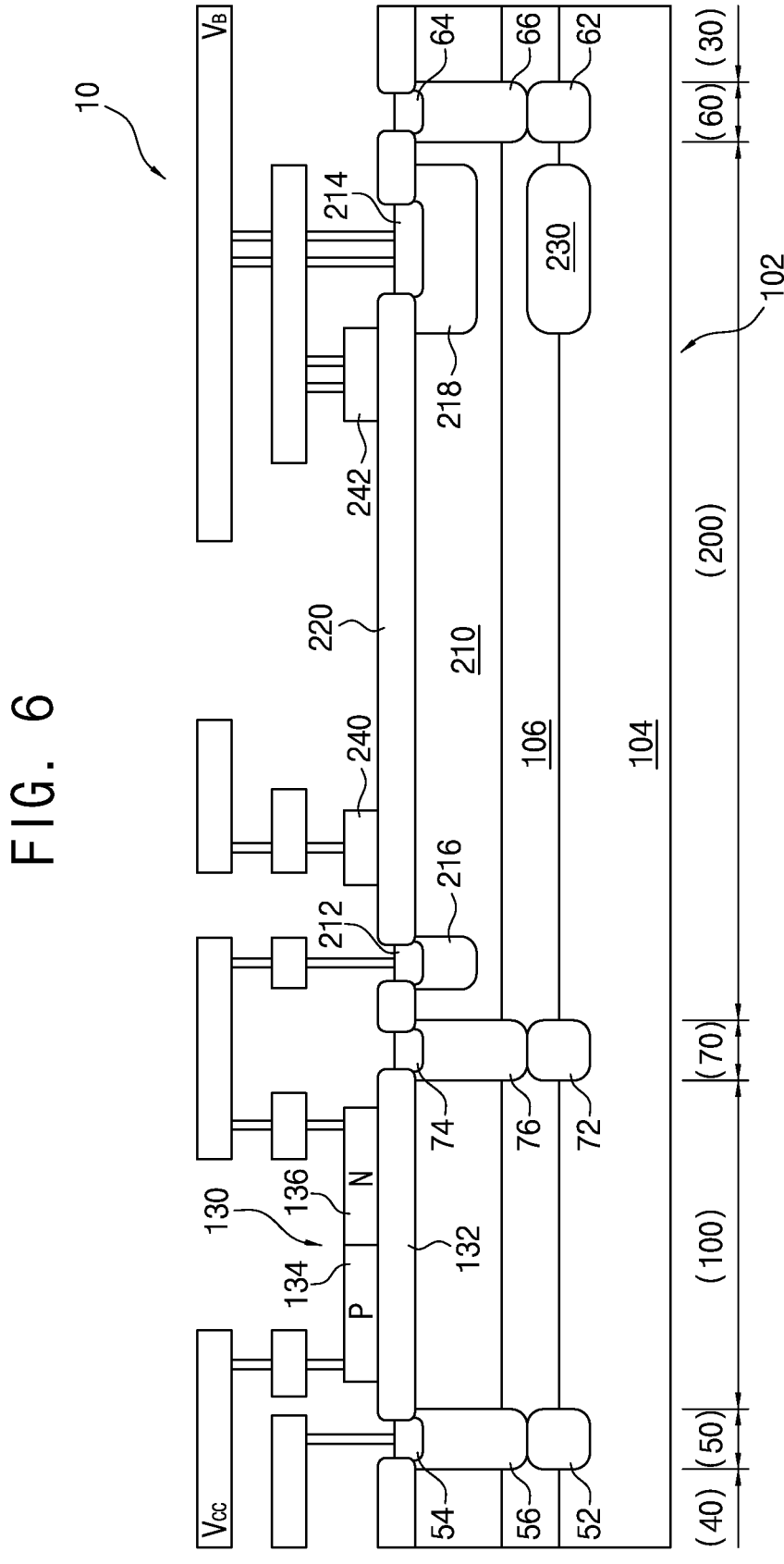
FIGS. 6 to 8 are schematic cross-sectional views illustrating another example of the switching unit as shown in FIG. 3.
Figure 7:
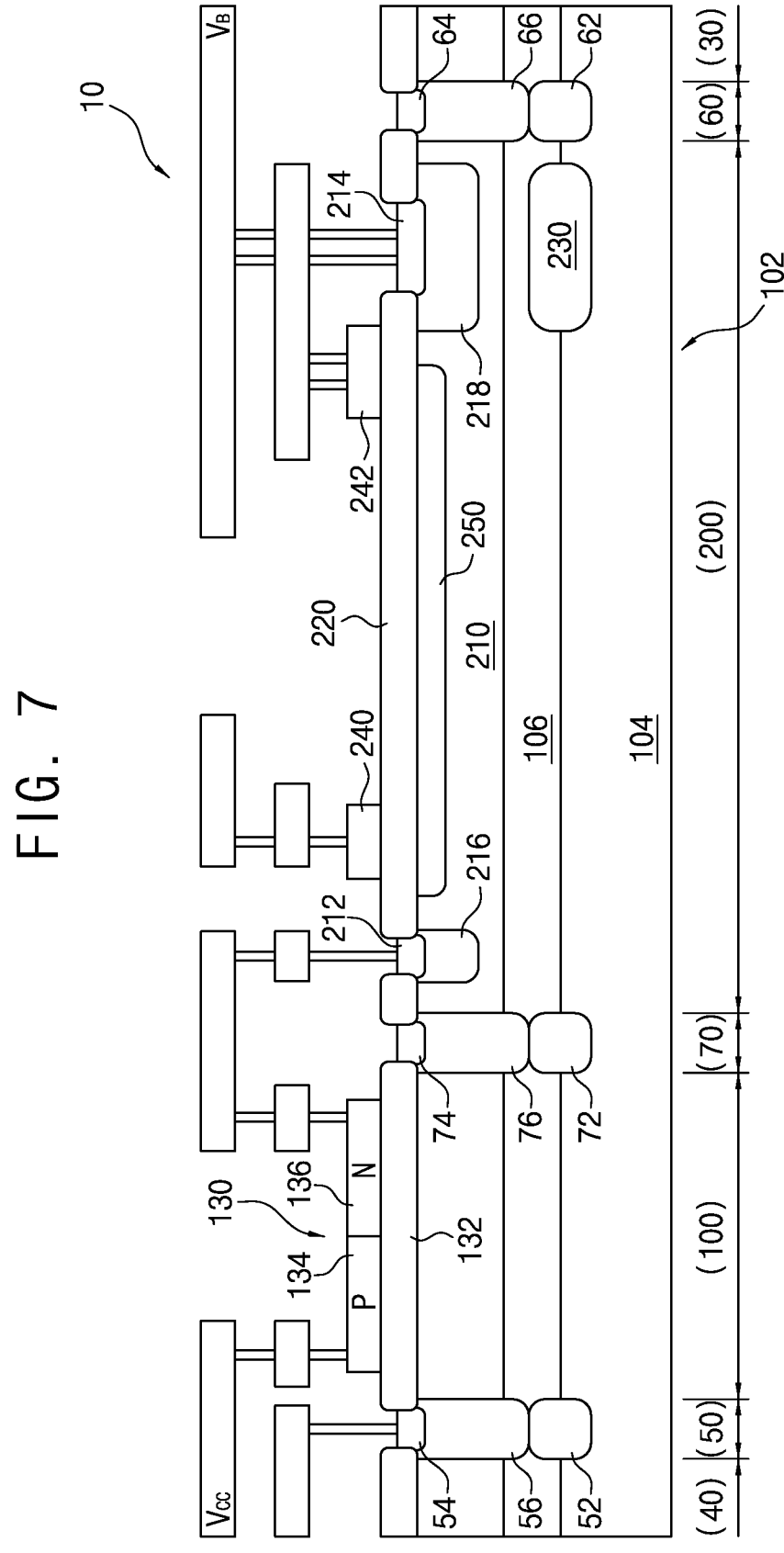
Figure 8:
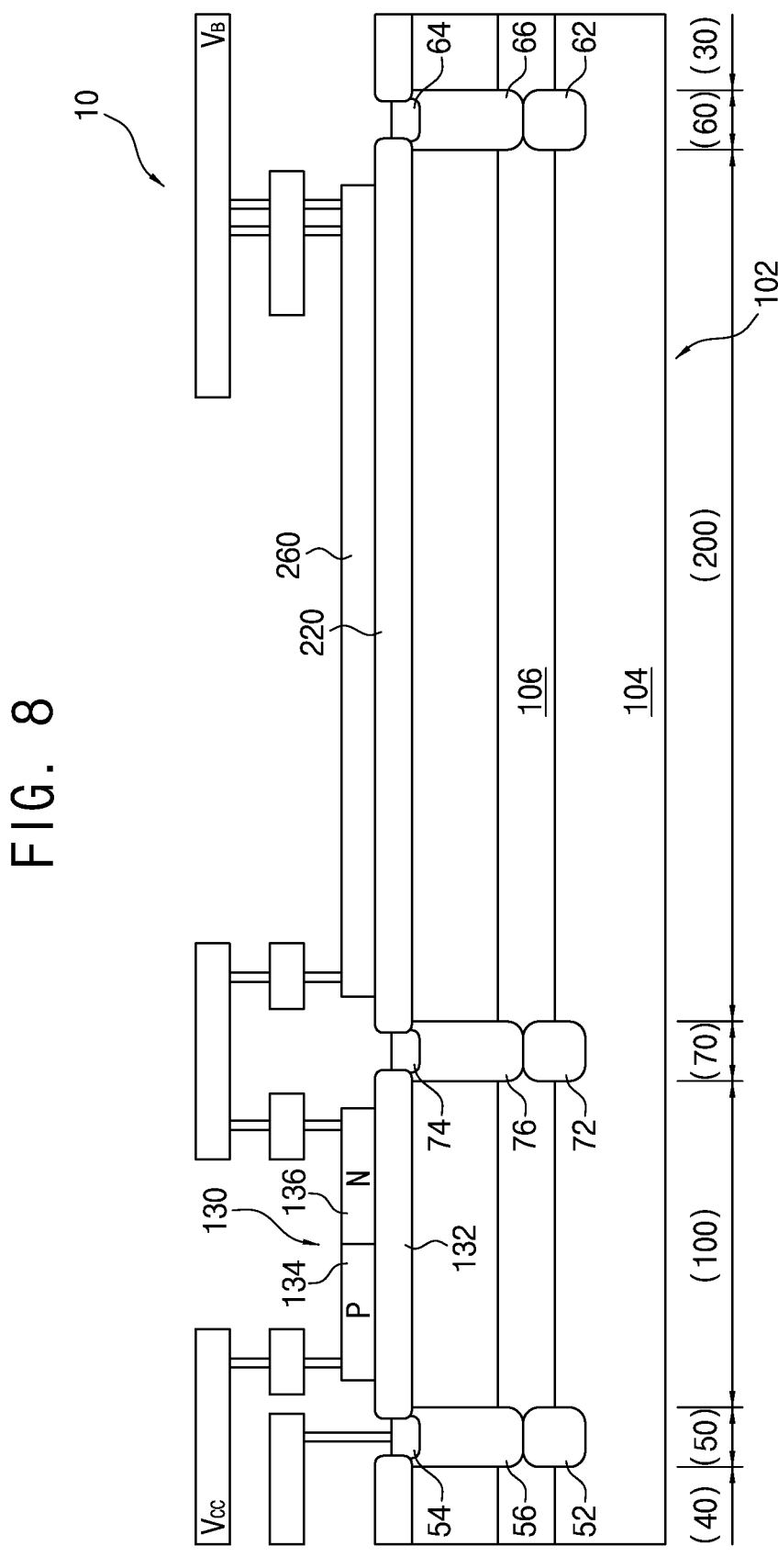

FIGS. 6 to 8 are schematic cross-sectional views illustrating another example of the switching unit as shown in FIG. 3.

Referring to FIGS. 6 to 8, the switching unit 100 may include a diode 130 formed on the substrate 102. The diode 130 may include a field oxide layer 132 formed on the substrate 102, an anode layer 134 formed on the field oxide layer 132, and a cathode layer 136 formed on the field oxide layer 132. For example, the anode layer 134 may be formed of polysilicon doped with P-type impurities, and the cathode layer 136 may be formed of polysilicon doped with N-type impurities.

The anode layer 134 may be electrically connected to the driving power source $V_{CC}$, and the cathode layer 136 may be electrically connected to the resistance unit 200. For example, as shown in FIGS. 6 and 7, the cathode layer 136 may be electrically connected to the first N-type contact region 212 of the resistance unit 200. As another example, as shown in FIG. 8, the cathode layer 136 may be electrically connected to one end portion of the resistive layer 260 of the resistance unit 200.

In accordance with the embodiments of the present disclosure as described above, there is no need to additionally use a transistor to prevent the high voltage from being applied to the switching unit 100 from the high voltage unit 30, and accordingly, the size of the power semiconductor device 10 may be reduced. Further, an electron movement distance may be reduced compared to the prior art, and electrical resistance may be reduced by the N-type impurity diffusion region 210. Accordingly, a current flowing from the driving power source $V_{CC}$ to the capacitor C may increase.

Although the example embodiments of the present disclosure have been described with reference to the specific embodiments, they are not limited thereto. Therefore, it will be readily understood by those skilled in the art that various modifications and changes can be made thereto without departing from the spirit and scope of the present disclosure defined by the appended claims.

The invention claimed is:

1. A power semiconductor device comprising:
a high voltage unit configured to output a high voltage;
a low voltage unit configured to output a low voltage;
a capacitor electrically connected to the high voltage unit and configured to supply power to the high voltage unit while the high voltage is output;
a switching unit electrically connected to the high voltage unit and the capacitor and configured to connect the capacitor to a driving power source to charge the capacitor while the low voltage is output and to prevent the high voltage unit from being electrically connected to the driving power source while the high voltage is output; and
a resistance unit electrically connected between the switching unit and the high voltage unit and configured to drop the high voltage to a voltage lower than a breakdown voltage of the switching unit while the high voltage is output,
wherein the resistance unit comprises an N-type impurity diffusion region in an upper portion of an N-type epitaxial layer in a substrate and electrically connected between the switching unit and the high voltage unit.

2. The power semiconductor device of claim 1, wherein the switching unit comprises a bipolar junction transistor or a diode.

3. The power semiconductor device of claim 1, wherein the resistance unit further comprises a field oxide layer disposed on the substrate.

4. The power semiconductor device of claim 3, wherein the resistance unit further comprises a P-type impurity diffusion region disposed between the N-type impurity diffusion region and the field oxide layer.

5. The power semiconductor device of claim 4, wherein the switching unit comprises a bipolar junction transistor or a diode.

6. The power semiconductor device of claim 3,
wherein the resistance unit further comprises:
a first electrode layer disposed on the field oxide layer adjacent to the switching unit and electrically connected to a ground terminal; and
a second electrode layer disposed on the field oxide layer adjacent to the high voltage unit and electrically connected to the high voltage unit.

7. The power semiconductor device of claim 1,
wherein the resistance unit further comprises:
a first contact region disposed on one side of the N-type impurity diffusion region and electrically connected to the switching unit; and
a second contact region disposed on another side of the N-type impurity diffusion region and electrically connected to the high voltage unit.

8. The power semiconductor device of claim 7,
wherein the resistance unit further comprises:
an N-type buried layer disposed below the second contact region and configured to disperse an electric field generated by the high voltage when the high voltage is applied to the second contact region.

9. The power semiconductor device of claim 1,
wherein the resistance unit comprises:
a field oxide layer disposed on a substrate; and
a resistive layer disposed on the field oxide layer.

10. The power semiconductor device of claim 9, wherein the resistive layer includes polysilicon doped with N-type impurities.

11. The power semiconductor device of claim 9, wherein the switching unit comprises a bipolar junction transistor or a diode.

* * * * *